(12) United States Patent
Adachi

(10) Patent No.: US 7,705,379 B2
(45) Date of Patent: Apr. 27, 2010

(54) FIELD EFFECT TRANSISTOR AND SOLID STATE IMAGE PICKUP DEVICE

(75) Inventor: Satoru Adachi, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 308 days.

(21) Appl. No.: 11/762,795

(22) Filed: Jun. 14, 2007

(65) Prior Publication Data
US 2007/0290238 A1 Dec. 20, 2007

(51) Int. Cl.
*H01L 31/062* (2006.01)
*H01L 31/113* (2006.01)

(52) U.S. Cl. ....................... 257/292; 257/291

(58) Field of Classification Search ......... 257/290–292, 257/E27.132, E27.133
See application file for complete search history.

(56) References Cited

U.S. PATENT DOCUMENTS 6,489,643 B1 * 12/2002 Lee et al. .................... 257/292
7,279,672 B2 * 10/2007 Hong ...................... 250/208.1
2007/0145447 A1 * 6/2007 Lee et al. .................... 257/292

* cited by examiner

*Primary Examiner*—Hung Vu
(74) *Attorney, Agent, or Firm*—John J. Patti; Wade J. Brady, III; Frederick J. Telecky, Jr.

(57) ABSTRACT

A solid-state image pickup device improves the linearity of signal $S_1$ and increases the saturation level in a solid-state image pickup device with an expanded dynamic range, and a field effect transistor used in the solid-state image pickup device. For the field effect transistor, gate electrode 60 is formed via gate insulating film 50 in a channel forming region of a first semiconductor layer 11 of a first electroconductivity type. A pair of second semiconductor layers (40, 41) of a second electroconductivity type are formed on the surface layer of the first semiconductor layer 11 on both sides of gate electrode 60. A third semiconductor layer 43 of the second electroconductivity type is formed in the first semiconductor layer 11 at a prescribed depth below the channel forming region and is connected to the second semiconductor layer 40. A solid-state image pickup device in which the field effect transistor is used as an amplification transistor is also disclosed.

16 Claims, 10 Drawing Sheets

FIELD EFFECT TRANSISTOR AND SOLID STATE IMAGE PICKUP DEVICE

FIELD OF THE INVENTION

The present invention pertains to field effect transistor and solid-state image pickup device. In particular, the present invention pertains to a field effect transistor formed by a CMOS process and a solid-state image pickup device having a field effect transistor formed by a CMOS process in its pixels.

BACKGROUND OF THE INVENTION

The characteristics of a CMOS (complementary metal-oxide-semiconductor) image sensor or CCD (charge coupled device) image sensor or other image input sensors have been improved, and the demand for them in the fields of digital cameras and camera-attached cellular phones, etc. has increased. 1.

It is desired to further improve the characteristics of said image sensors. For example, it is desired to expand their dynamic range.

Solid-state image pickup devices designed to expand the dynamic range are disclosed in Japanese Kokai Patent Application No. 2003-134396, Japanese Kokai Patent Application No. 2000-165754, Japanese Kokai Patent Application No. 2002-77737 and Japanese Kokai Patent Application No. Hei 5[1993]-90556. However, it is difficult for these solid-state image pickup devices to have an expanded dynamic range while keeping high sensitivity and a high S/N ratio. The solid-state image pickup device described in Japanese Kokai Patent Application No. 2005-328493 was developed in order to solve this problem.

In the solid-state image pickup device described in Japanese Kokai Patent Application No. 2005-328493, the photocharge overflowing from the photodiode of each pixel is stored in a floating diffusion and an electrostatic capacitance element. Signal $S_1$ is read from the photoelectrons in the photodiode when photoelectrons are not overflowing from the photodiode. When overflow occurs, the photoelectrons in the photodiode are combined with the photoelectrons overflowing from the photodiode to read signal $S_1+S_2$ as the signal of each pixel.

In the solid-state image pickup device described in Japanese Kokai Patent Application No. 2005-328493, the floating diffusion in each pixel is connected to the gate electrode of an amplification transistor known as a source follower. The photocharge is converted into a voltage and is subjected to current amplification as the current between the source and drain of the transistor in the source follower. The signal level is maintained in the analog memory part in the solid-state image pickup device and is read out for each line.

In this case, the gain of the source follower of a pixel is not 1 due to a substrate bias effect. If the gain of the source follower is represented by A, a gate capacitance expressed as $(1-A)*(C_{ox}+C_{gs})$ is added to the parasitic capacitance of the floating diffusion.

Also, since the threshold value of the source follower varies depending on the signal level due to the substrate bias effect, the output of the pixel is nonlinear. In order to obtain gain of signal $S_1$ in the pixel part, the gain of the source follower must be close to 1. In order to realize this objective, a method that connects the source potential to a well in the transistor to reduce the substrate bias effect is well known. In fact, however, it is difficult to form a well that applies a source voltage individually in a pixel.

If the capacitance of the floating diffusion is reduced excessively, the capacitance of the floating diffusion becomes smaller than that of the photodiode. As a result, the saturation level of signal $S_1$ drops.

The problem to solve is that it is difficult to improve the linearity of signal $S_1$ and increase the saturation level in a solid-state image pickup device with an expanded dynamic range.

SUMMARY OF THE INVENTION

It is a general object of the present invention to provide a field effect transistor image pickup device.

This and other objects and features are provided, in accordance with one aspect of the present invention, by a field effect transistor having a first semiconductor layer of a first electroconductivity type having a channel forming region, a gate electrode formed via a gate insulating film on said channel forming region of the first semiconductor layer, a pair of second semiconductor layers of a second electroconductivity type formed on the surface of the first semiconductor layer on the two sides of said gate electrode, and a third semiconductor layer of the second electroconductivity type formed in the first semiconductor layer at a prescribed depth below said channel forming region and connected to one of the second semiconductor layers.

For the aforementioned field effect transistor of one aspect of the present invention, the gate electrode is formed via a gate insulating film on said channel forming region of the first semiconductor layer of a first electroconductivity type. The pair of second semiconductor layers of the second electroconductivity type are formed on the surface of the first semiconductor layer on the two sides of said gate electrode. The third semiconductor layer of the second electroconductivity type is formed in the first semiconductor layer at a prescribed depth below said channel forming region and connected to one of the second semiconductor layers. For an aspect of the aforementioned field effect transistor of the present invention, preferably, a puncture inhibiting layer of the first electroconductivity type is formed between the third semiconductor layer and the other second semiconductor layer in the first semiconductor layer.

Another aspect of the present invention provides a solid-state image pickup device formed by integrating plural pixels having the following components in an array pattern on a semiconductor substrate: a photodiode that receives light and generates and stores photocharge; a transfer transistor that transfers the photocharge from said photodiode; a floating diffusion to which said photocharge is transferred via said transfer transistor; a storage capacitance element that is connected to said photodiode via said transfer transistor and at least stores the photocharge overflowing from said photodiode via said transfer transistor during a storage operation; a storage transistor that couples or separates the potentials of said floating diffusion and storage capacitance element and has one of the source/drain regions acting as said floating diffusion and the other source/drain region connected to said storage capacitance element; and an amplification transistor, which is a field effect transistor having a first semiconductor layer of a first electroconductivity type having a channel forming region, a gate electrode formed via an insulating film on said channel forming region of the first semiconductor layer and connected to said floating diffusion, a pair of second semiconductor layers of a second electroconductivity type formed on the surface of the first semiconductor layer on the two sides of said gate electrode, and a third semiconductor layer of the second electroconductivity type formed in the first semiconductor layer at a prescribed depth below said channel forming region and connected to one of the second semiconductor layers.

An aspect of the aforementioned solid-state image pickup device of the present invention is formed by integrating plural pixels having the following components in an array pattern on a semiconductor substrate: a photodiode that receives light and generates and stores a photocharge; a transfer transistor that transfers the photocharge from said photodiode; a floating diffusion to which said photocharge is transferred via said transfer transistor; a storage capacitance element that is connected to said photodiode via said transfer transistor and at least stores the photocharge overflowing from said photodiode via said transfer transistor during a storage operation; a storage transistor that couples or separates the potentials of said floating diffusion and storage capacitance element and has one of the source/drain regions acting as said floating diffusion and the other source/drain region connected to said storage capacitance element; and an amplification transistor. In this case, the amplification transistor is a field effect transistor, in which the gate electrode is formed via a gate insulating film on said channel forming region of a first semiconductor layer of a first electroconductivity type, a pair of second semiconductor layers of a second electroconductivity type are formed on the surface of the first semiconductor layer on the two sides of said gate electrode, and a third semiconductor layer of the second electroconductivity type is formed in the first semiconductor layer at a prescribed depth below said channel forming region and is connected to one of the second semiconductor layers. For this aspect of the aforementioned solid-state image pickup device of the present invention, preferably, a puncture inhibiting layer of the first electroconductivity type is formed between the third semiconductor layer and the other second semiconductor layer in the first semiconductor layer.

An aspect of the aforementioned solid-state image pickup device of the present invention also has a first wiring formed to connect said floating diffusion and gate electrode and a second wiring formed to be connected to one of said second semiconductor layers. The first and second wirings have a superimposed region via an insulating film; an electrostatic capacitance element is formed by said first wiring, insulating film, and second wiring. An aspect of the aforementioned solid-state image pickup device of the present invention controls the potential of said floating diffusion by controlling the potential of the second wiring. An aspect of the aforementioned solid-state image pickup device of the present invention also has a reset transistor connected to said storage capacitance element or floating diffusion and used to discharge the photocharge in said storage capacitance element and/or said floating diffusion. An aspect of the solid-state image pickup device of the present invention also has a selecting transistor that is connected in series with said amplification transistor and has a gate electrode for the selecting transistor and is used to select said pixels.

REFERENCE NUMERALS AND SYMBOLS AS SHOWN IN THE DRAWINGS

Figure 10:
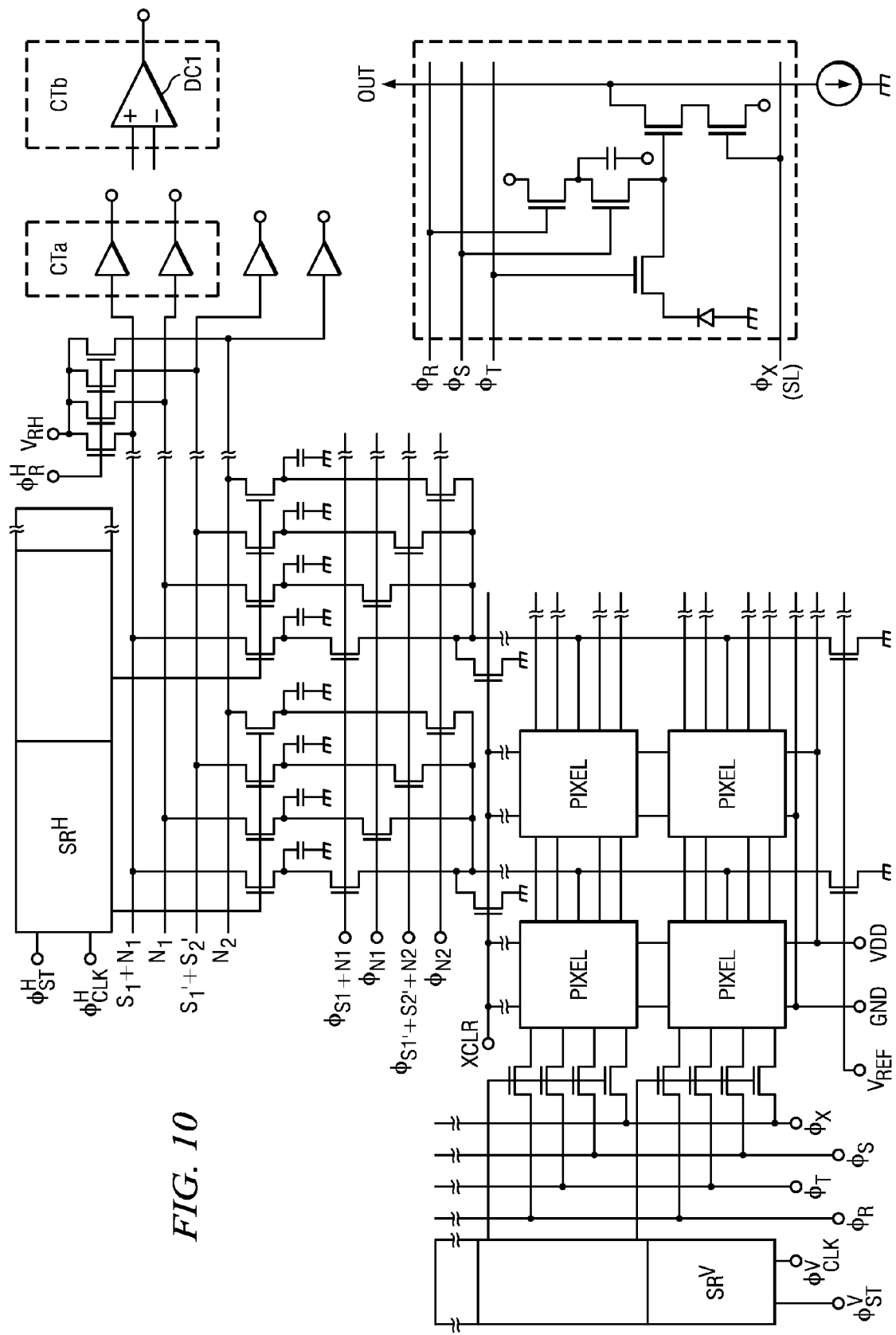
FIG. 10 is an equivalent circuit diagram illustrating the entire circuit configuration of the CMOS image sensor disclosed in the embodiment of the present invention.

In the figures 10 represents an n-type semiconductor, 11 represents a p-well, 12 represents an p+-type separating region, 13 represents an n-type semiconductor region, 14, 17 represents an p+-type semiconductor region, 15, 16 represents an n+-type semiconductor region, 20, 21, 22 represents an element separating insulating film, 23, 24 represents a gate insulating film, 25 represents a capacitance insulating film, 30, 31 represents a gate electrode, 32 represents an upper electrode, 33, 34 represents an wiring, 40, 41, 42, 43, 44 represents an n+-type semiconductor region, 45 represents an p+-type semiconductor region, 50, 51 represents a gate insulating film, 52 represents a first interlayer insulating film, 53 represents a second interlayer insulating film, 60, 61 represents a gate electrode, 62, 63, 64 represents a first wiring, 65 represents a second wiring, ADC1-3 A/D represents a converter, AP represents an amplifier, $C_{FD}$, $C_{PD}$, C represents a capacitance, $C_S$ represents a storage capacitance element, CH represents a chip, CP represents a comparator, $CT_a$, $CT_b$ represents a circuit, DC1, DC2 represents a differential amplifier, FD represents a floating diffusion, FM represents a frame memory, GND represents a ground, LT represents a light, N1 represents a signal with the reset level of CFD (noise), $N_2$ represents a signal with the reset level of $C_{FD}+C_S$ (noise), Noise represents noise, Vout represents a pixel output (line), PD represents a photodiode, Pixel represents a pixel, QA represents an oversaturation charge, $Q_{A1}$, $Q_{A2}$ represents a part of oversaturation charge, $Q_B$ represents a pre-saturation charge, S1 represents a pre-saturation charge signal, S1' represents a modulated pre-saturation charge signal, S2 represents an oversaturation charge signal, S2' represents a modulation oversaturation charge signal, SE represents a selector, SL represents a selecting line, $SR^H$ represents a column shift register, $SR^V$ represents a row shift register, $T_1$-$T_4$ represents a time, Tr1 represents a transfer transistor, Tr2 represents a storage transistor, Tr3 represents a reset transistor, Tr4 represents an amplification transistor (source follower), Tr5 represents a selecting transistor, VDD represents a power supply voltage, φT, φS, φR, φX, $\phi_{S1+N1}$, $\phi_{N1}$, $\phi_{S1'+S2'+N2}$, $\phi_{N2}$, $\phi_{V1}$, $\phi_{V2}$ represents a driving line, S/F represents a source follower,

DESCRIPTION OF THE EMBODIMENTS

When the field effect transistor of one aspect of the present invention is used in a solid-state image pickup device with an expanded dynamic range, the linearity of signal $S_1$ can be improved, and the saturation level can be increased. The solid-state image pickup device of one aspect of the present invention can improve the linearity of signal $S_1$ and increase the saturation level for a solid-state image pickup device with an expanded dynamic range.

In the following, embodiments of a solid-state image pickup device and a field effect transistor used as an amplification transistor (source follower) in its pixels will be explained based on figures.

Figure 1:
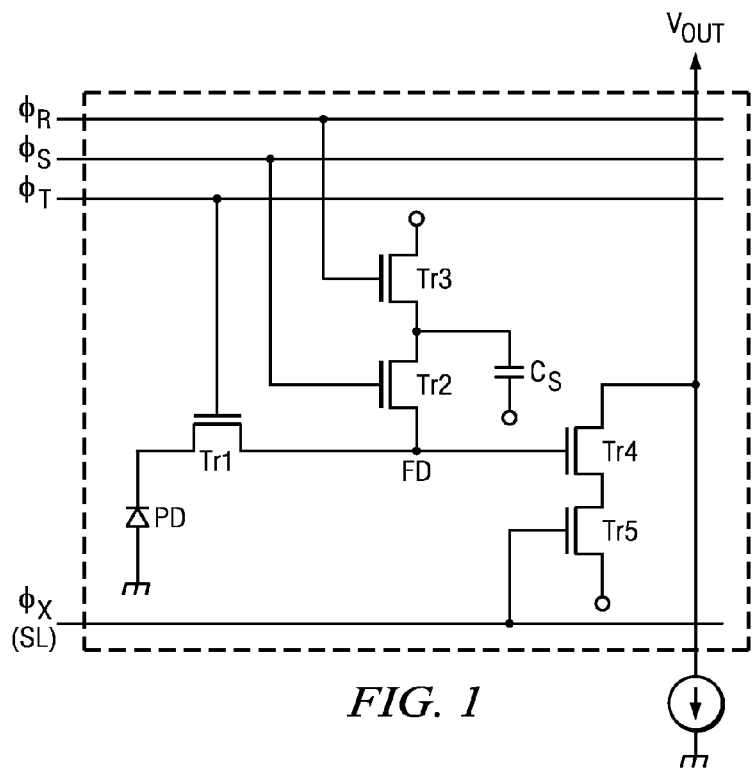
FIG. 1 is the equivalent circuit of one pixel of a CMOS image sensor disclosed in an embodiment of the present invention.

The solid-state image pickup device disclosed in this embodiment is a CMOS image sensor. FIG. 1 is the equivalent circuit diagram of one pixel (pixel). Each pixel is a so-called 5-transistor type CMOS image sensor comprised of a photodiode PD that receives light to generate and store photocharge, transfer transistor Tr1 that transfers the photocharge from photodiode PD, floating diffusion FD to which the photocharge is transferred through transfer transistor Tr1, storage capacitance element $C_S$ that stores the photocharge overflowing from said photodiode during the storage operation, storage transistor Tr2 that couples or separates the potentials of said floating diffusion FD and storage capacitance element $C_S$, reset transistor Tr3 that is connected to floating diffusion FD and is used to discharge the photocharge in floating diffusion FD, amplification transistor (source follower) Tr4 that amplifies and converts the photocharge in floating diffusion FD into a voltage signal, and selecting transistor Tr5 that is connected to the source follower and is used to select a pixel. For example, the aforementioned five transistors are all n-channel MOS transistors.

The CMOS image sensor disclosed in this embodiment is formed by integrating plural pixels with the aforementioned configuration in an array pattern. In each pixel, driving lines φ$_T$, φ$_S$, φ$_R$ are connected to the gate electrodes of transfer transistor Tr1, storage transistor Tr2, reset transistor Tr3, respectively. Also, a pixel selecting line SL (φX) driven by a row shift register is connected to the gate electrode of selecting transistor Tr5. Pixel output line Vout is connected to the output side source/drain of amplification transistor Tr4. It is controlled and output by a column shift register. Selecting transistor Tr5 and driving line $\phi_X$ can also be omitted since a pixel can be selected or not selected by fixing the voltage of floating diffusion FD at an appropriate level.

Figure 2:
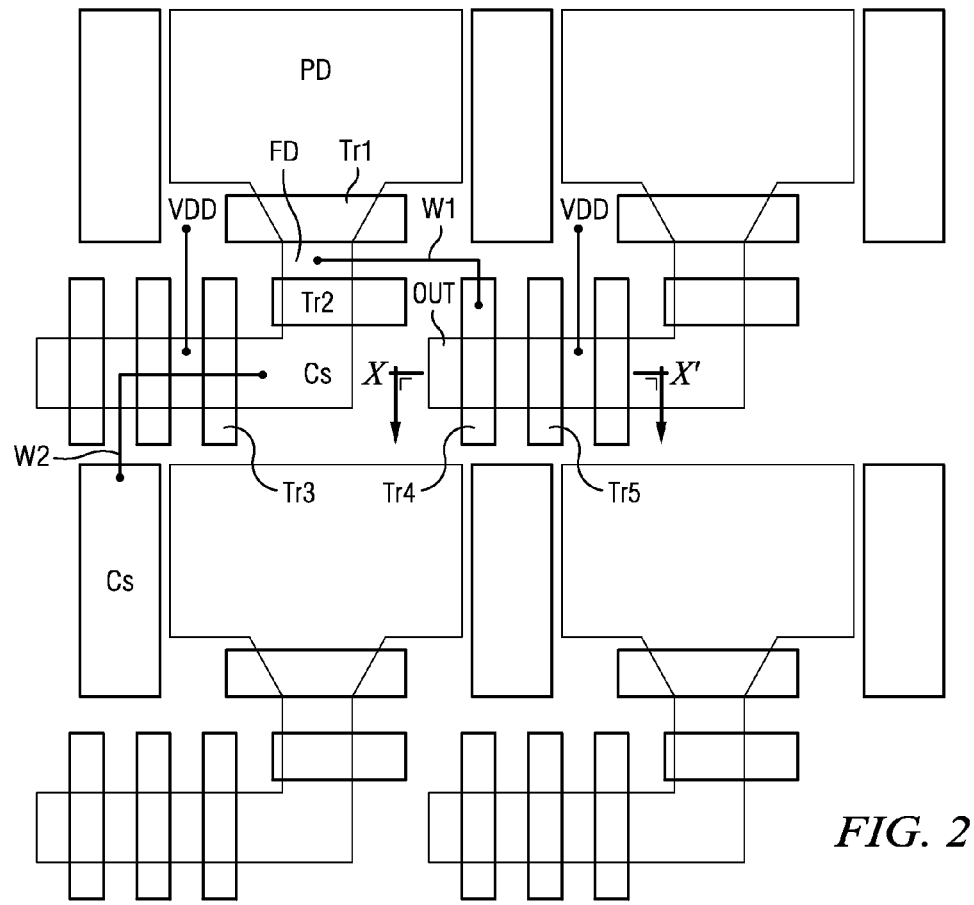
FIG. 2 shows an example of the layout diagram of approximately one pixel in the case of adopting a planar type storage capacitance element in the CMOS image sensor disclosed in the embodiment of the present invention.

FIG. 2 is an example of the layout diagram of a pixel (pixel) when a planar type storage type capacitance element is used in the CMOS solid-state image pickup device disclosed in this embodiment.

Photodiode PD, storage capacitance element $C_S$, and five transistors Tr1-Tr5 are arranged as shown in the figure. Also, floating diffusion FD between transistors Tr1 and Tr2 is connected to the gate of transistor Tr4 by wiring W1. Also, the diffusion layer between transistors Tr2 and Tr3 is connected to the upper electrode of storage capacitance element $C_S$ by wiring W2. In this way, a circuit equivalent to the equivalent circuit diagram of this embodiment shown in FIG. 1 can be realized. In this layout, the channel width of transfer transistor Tr1 is wider on the side of photodiode PD and is narrow on the side of floating diffusion FD. Consequently, charge overflowing from the photodiode can overflow efficiently to the side of the floating diffusion. On the other hand, since the channel width is narrow on the side of floating diffusion FD, the capacitance of floating diffusion FD can be reduced. The variation in potential with respect to the charge stored in floating diffusion FD can be increased.

Figure 3:
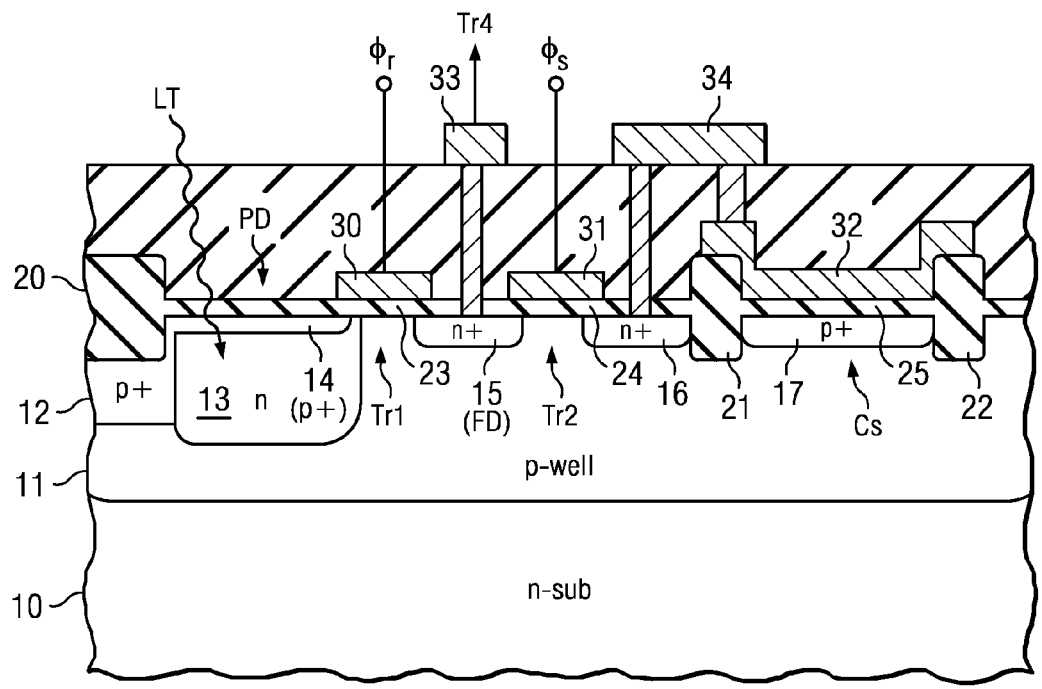
FIG. 3 is a schematic cross-sectional view of a part of each pixel in the CMOS image sensor disclosed in the embodiment of the present invention.

FIG. 3 is a schematic cross-sectional view in a part of each pixel (photodiode PD, transfer transistor Tr1, floating diffusion FD, storage transistor Tr2, and storage capacitance element $C_S$) in the CMOS image sensor disclosed in this embodiment.

For example, a p-well 11 is formed in an n-type silicon semiconductor substrate (n-sub) 10. Element separating insulating films (20, 21, 22) are formed using the LOCOS method that divides the regions of each pixel and storage capacitance element. $C_S$ A p+-type separating region 12 is formed in p-well 11 equivalent to the area below element separating insulating film 20 that separates the pixels. N-type semiconductor region 13 is formed in p-well 11. p+-type semiconductor region 14 is formed on its surface layer. A charge transfer burying type photodiode PD is constituted by said pn junction. When an appropriate bias is applied to the pn junction and light LT is incident into the formed depletion layer, photocharge is generated as a result of the photoelectric effect.

A region is formed projecting from p+-type semiconductor region 14 at the end of n-type semiconductor region 13. n+-type semiconductor region 15 acting as floating diffusion FD is formed on the surface layer of p-well 11 at a prescribed distance from said region. Also, n+-type semiconductor region 16 is formed on the surface layer of p-well 11 at a prescribed distance from said region. In this case, in the region of n-type semiconductor region 13 and n+-type semiconductor region 15, gate electrode 30 made of polysilicon is formed on p-well 11 via gate insulating film 23 made of silicon oxide. n-type semiconductor region 13 and n+-type semiconductor region 15 are used as source/drain. In this way, transfer transistor Tr1 having a channel forming region is formed on the surface layer of p-well 11.

Also, in the region of n+-type semiconductor region 15 and n+-type semiconductor region 16, gate electrode 31 made of polysilicon is formed via gate insulating film 24 made of silicon oxide on p-well 11. n+-type semiconductor region 15 and n+-type semiconductor region 16 are used as source/drain. In this way, storage transistor Tr2 having a channel forming region is formed on the surface layer of p-well 11.

Also, in the region separated by element separating insulating films (21, 22), p+-type semiconductor region 17 acting as a lower electrode is formed on the surface layer of p-well 11. Upper electrode 32 made of polysilicon is formed on it via capacitance insulating film 25 made of silicon oxide. In this way, storage capacitance element Cs is formed.

An insulating film made of silicon oxide is formed to cover transfer transistor Tr1, storage transistor Tr2, and storage capacitance element Cs. An opening part reaching n+-type semiconductor region 15, n+-type semiconductor region 16, and upper electrode 32 is formed. Wiring 33 is formed to connect with n+-type semiconductor region 15, while wiring 34 is formed to connect n+-type semiconductor region 16 and upper electrode 32. Driving line $\phi_T$ is formed to connect to the gate electrode 30 of transfer transistor Tr1. Driving line $\phi_S$ is formed to connect to the gate electrode 31 of storage transistor Tr2.

Figure 4A:
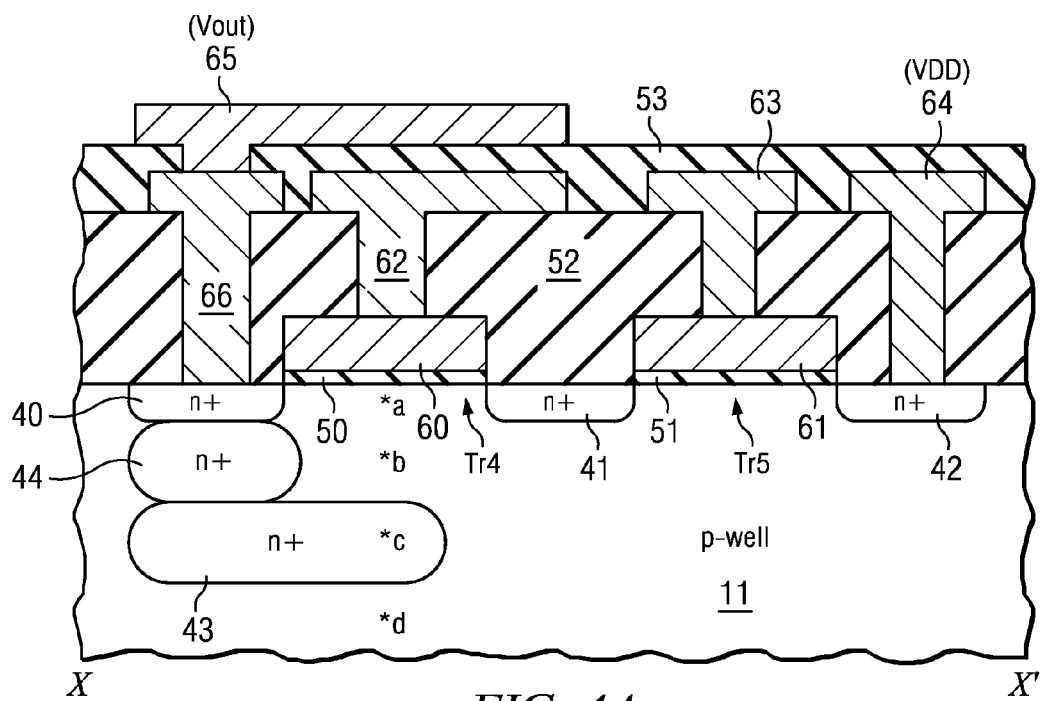
FIG. 4(A) is a schematic cross-sectional view of a part (source follower and selecting transistor) of each pixel in the CMOS image sensor disclosed in the embodiment of the present invention.

FIG. 4(A) is a schematic cross-sectional view illustrating a part (source follower Tr4 and selecting transistor Tr5) of each pixel in the CMOS image sensor disclosed in the present embodiment.

For example, gate electrode 60 made of polysilicon is formed via gate insulating film 50 made of silicon oxide on the top of p-well (first semiconductor layer) 11 formed in an n-type semiconductor substrate. A pair of n+-type semiconductor regions (second semiconductor layer) (40, 41) is formed on the surface layer of p-well 11 on both sides of gate electrode 60. n+-type semiconductor regions (40, 41) are used as source/drain. In this way, source follower Tr4 is formed as an n-channel type field effect transistor having a channel forming region on the surface layer of p-well 11.

In this case, n+-type semiconductor region (third semiconductor layer) 43 is formed in p-well 11 at a prescribed depth below the channel forming region of source follower Tr4. n+-type semiconductor region 43 is connected by n+-type semiconductor region 44 to n+-type semiconductor region 40 acting as one of source/drain of source follower Tr4.

Also, for example, gate electrode 61 is formed via gate insulating film 51 on the top of p-well 11 in the same way as described above. A pair of n+-type semiconductor regions (41, 42) is formed on the surface layer of p-well 11 on both sides of gate electrode 61. n+-type regions (41, 42) are used as source/drain. In this way, selecting transistor Tr5 is formed as an n-channel type field effect transistor having a channel forming region on the surface layer of p-well 11. Said n+-type semiconductor region 41 is the source/drain of source follower Tr4. Source follower Tr4 and selecting transistor Tr5 are connected in series. Also, for example, a first interlayer insulating film 52 made of silicon oxide is formed to cover source follower Tr4 and selecting transistor Tr5.

Contact holes reaching the gate electrode 60 of source follower Tr4, the gate electrode 61 of selecting transistor Tr5, and n+-type semiconductor regions 40, 42 are formed in the first interlayer insulating film 52, and a first wiring (62, 63, 64, 66) made of a metal, etc. is formed. Also, for example, a contact hole reaching the first wiring 66 is formed in a second interlayer insulating film 53, and a second wiring 65 made of a metal, etc. is formed. Also, for example, the gate electrode 60 of source follower Tr4 is connected to a floating diffusion via the first wiring 62. On the other hand, a driving line for pixel selection is connected to the gate electrode 61 of selecting transistor Tr5.

Also, for example, power supply potential VDD is applied to the first wiring 64 connected to the n+-type semiconductor region 42 of said selecting transistor Tr5. On the other hand, pixel output Vout is output from the second wiring 65 connected to the n+-type semiconductor region 40 of source follower Tr4. In this case, the first wiring 62 connected to the gate electrode 60 of source follower Tr4 and the second wiring 65 connected to the n+-type semiconductor region 40 of source follower Tr4 have a superimposed region via the second interlayer insulating film 53. An electrostatic capacitance element is constituted by the first wiring 62, the second interlayer insulating film 53, and the second wiring 65.

Figure 4B:
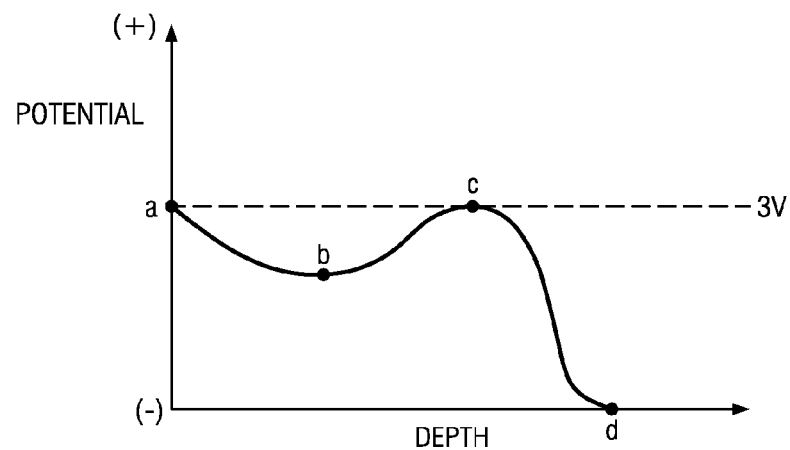
FIG. 4(B) shows the potential profile obtained by smoothly connecting the potentials at points a-d in FIG. 4(A).

FIG. 4(B) shows the potential profile in the depth direction of the semiconductor substrate in the channel forming region of source follower Tr4 with the potentials at points a-d in FIG. 4(A) connected smoothly. For example, 0 V is applied to p-well 11, pixel output Vout is 3 V, and a voltage of about 3 V is applied to the gate electrode 60 of source follower Tr4.

Depending on the voltage of 0 V applied to p-well 11 and the positive potentials applied to n+-type semiconductor regions (41, 42, 43), the p layer below the depleted channel forming region acts as a gate insulating film when n+-type semiconductor region 43 formed deeper is used as a back gate.

If the capacitance of the gate insulating film is $C_{ox}$ and the capacitance of the depletion layer is $C_{dep}$, the gain of the source follower is $C_{ox}/(C_{ox}+C_{dep})$. In order to keep the gain close to 1, the capacitance $C_{dep}$ of the depletion layer should be reduced. The capacitance $C_{dep}$ of the depletion layer can be reduced by lowering the impurity concentration in p-well 11. In this case, however, the source follower will be punctured.

In this embodiment, a back gate is connected to the source potential as described above. By moving the substrate potential and the gate potential together, Cdep can be considered to be virtually 0 without lowering the impurity concentration of p-well 11 so that the puncture problem can be avoided and the gain of source follower Tr4 can be kept at almost 1.

Figure 5:
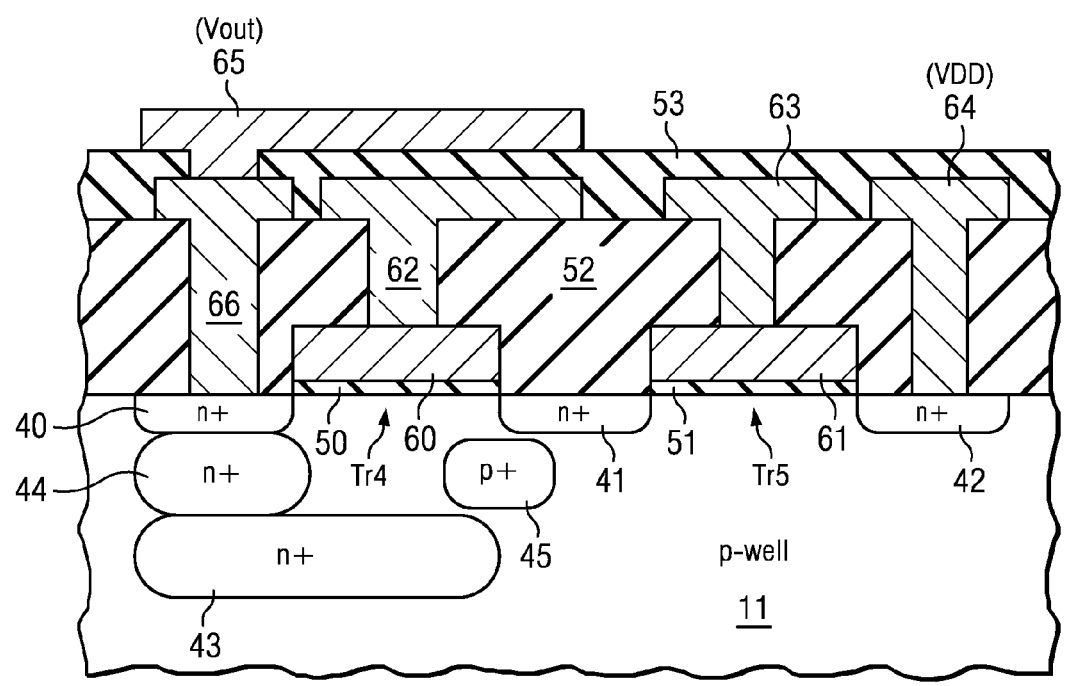
FIG. 5 is a schematic cross-sectional view of another example of a part (source follower and selecting transistor) of each pixel in the CMOS image sensor disclosed in the embodiment of the present invention.

FIG. 5 is a schematic cross-sectional view of another example illustrating a part (source follower Tr4 and selecting transistor Tr5) of each pixel in the CMOS image sensor disclosed in this embodiment.

In contrast with FIG. 4(A), a p+-type puncture inhibiting layer 45 is formed between n+-type semiconductor region (third semiconductor layer) 43 and n+-type semiconductor region 41 as the other source/drain of source follower Tr4 in p-well 11.

In source follower Tr4, it is necessary to neutralize the area between the two n+-type semiconductor regions (41, 43) so that n+-type semiconductor region 41 and n+-type semiconductor region 43 are not punctured even if the voltage applied to gate electrode 60 is 0 V. If the space between n+-type semiconductor region 41 and n+-type semiconductor region 43 is narrow, puncture inhibiting layer 45 is preferably formed containing a p-type impurity at a high concentration.

Figure 6:
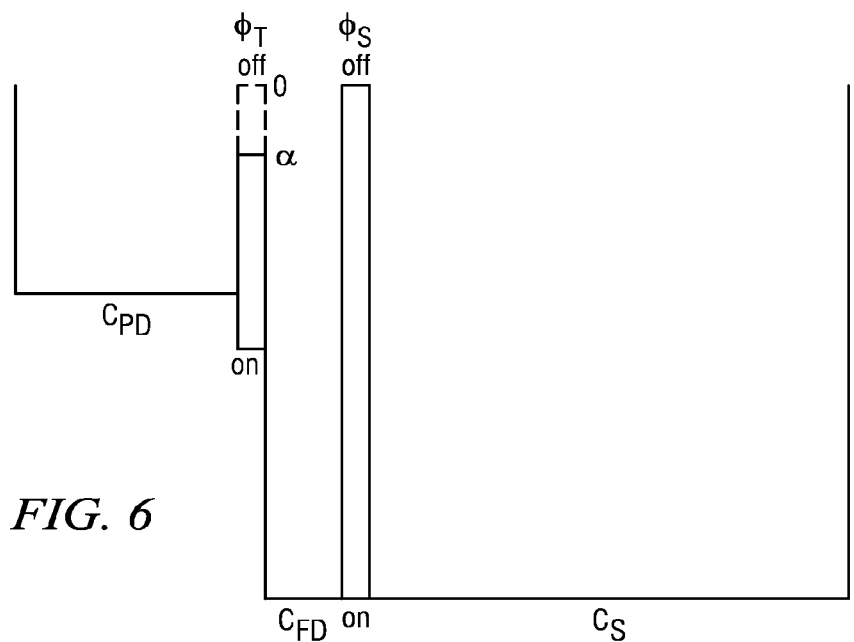
FIG. 6 is a schematic potential diagram corresponding to the photodiode—storage capacitance element in the CMOS image sensor disclosed in the embodiment of the present invention.

FIG. 6 is a schematic potential diagram of photodiode PD, transfer transistor Tr1, floating diffusion FD, storage transistor Tr2, and storage capacitance element CS of the solid-state image pickup device disclosed in this embodiment.

Photodiode PD constitutes capacitance $C_{PD}$ with a relatively shallow capacitance. Floating diffusion FD and storage capacitance element CS constitute capacitances ($C_{FD}$, $C_S$) with a relatively deep potential. In this case, transfer transistor Tr1 and storage transistor Tr2 assume two levels corresponding to on/off of the transistors.

Figure 7:
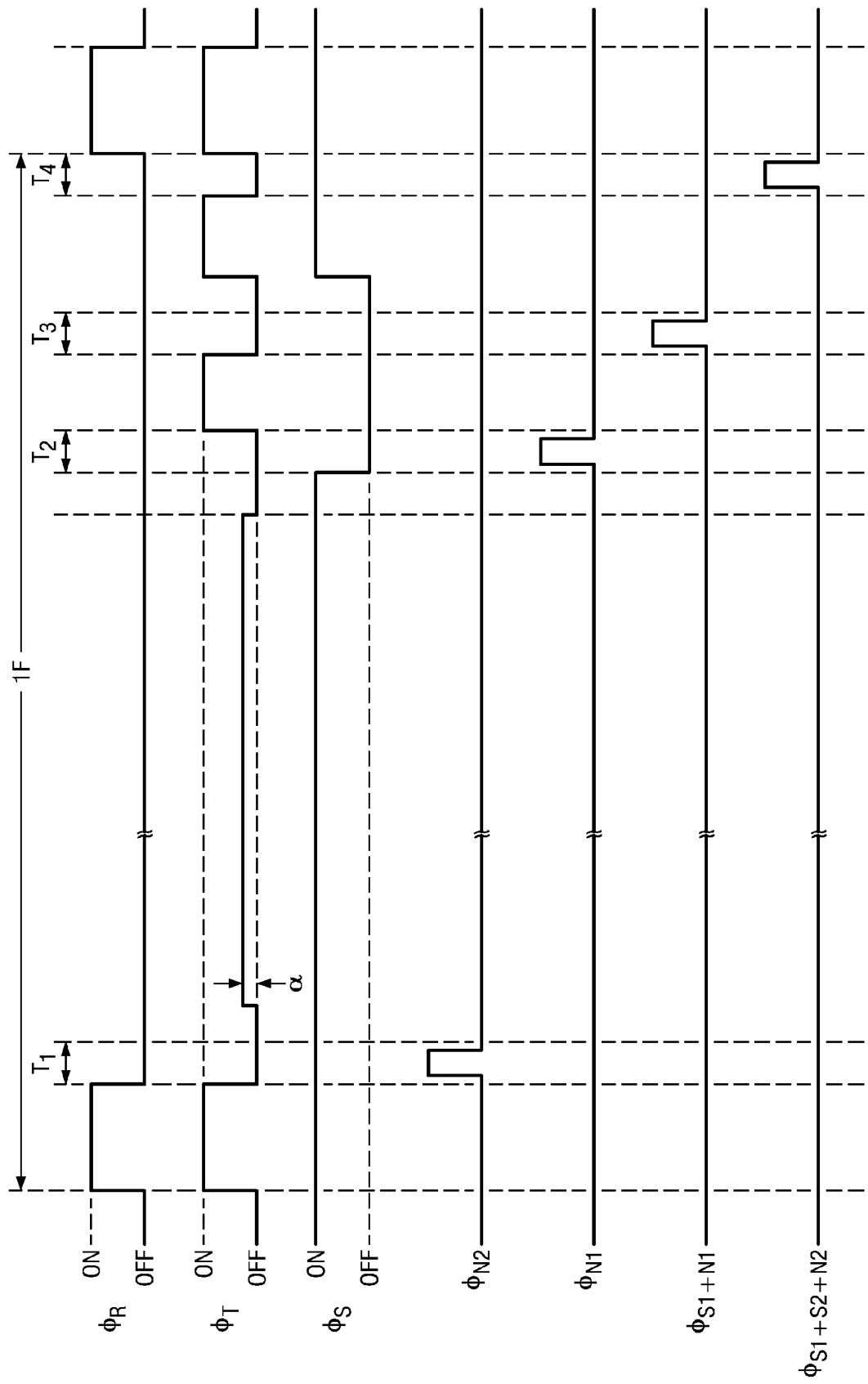
FIG. 7 is a timing chart illustrating the voltage applied to the driving lines of the CMOS image sensor disclosed in the embodiment of the present invention at two levels of on/off.

In the following, the driving method for the CMOS image sensor disclosed in this embodiment will be explained based on the equivalent circuit diagram show in FIG. 1 and the potential diagram shown in FIG. 6. FIG. 7 is a timing chart, in which the voltages applied to the driving lines ($\phi_T$, $\phi_S$, $\phi_R$) are shown at two levels of on/off and $\phi_T$ is shown at three levels including level (+α).

Although the voltage applied to driving line $\phi_T$ can also be shown at two levels of ON/(+α), if three levels are used as in this example, the maximum signal voltage for floating diffusion FD can be increased. When $\phi_T$ drives at two levels, the OFF level in FIG. 7 can be used as the (+α) level. Also, FIGS. 8(A)-(C) and FIGS. 9(D)-(F) correspond to the potential diagrams at each timing in the timing chart.

Figure 8A:
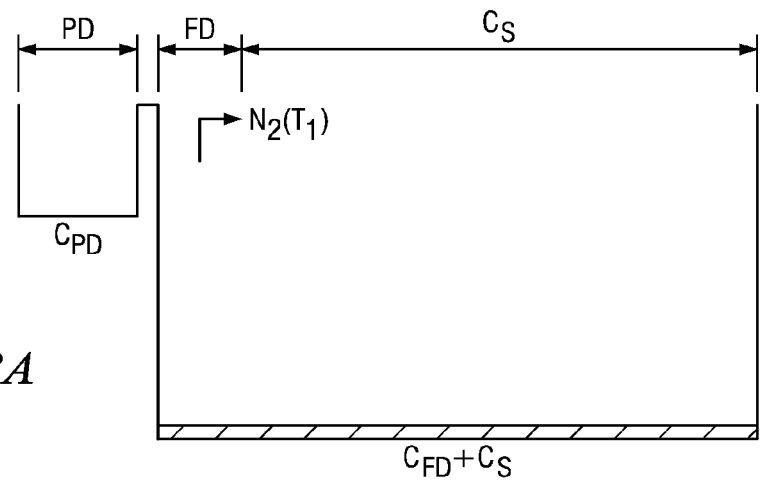
FIGS. 8(A)-(C) are schematic potential diagrams corresponding to the photodiode—storage capacitance element of the CMOS image sensor disclosed in the embodiment of the present invention.

First, at the beginning of one field (1F), with $\phi_S$ set in the on state, $\phi_T$, $\phi_R$ are turned on to discharge all the photocharge generated in the previous field and to reset the driving lines. At time $T_1$, $\phi_T$, $\phi_R$ are turned off. However, $\phi_T$ is at level (+α). At that time, as shown in FIG. 8(A), since $\phi_S$ is on, $C_{FD}$ and $C_S$ are coupled to each other. So-called kTC noise is generated in $C_{FD}+C_S$ along with the reset operation immediately after reset. At that time, $\phi_{N2}$ is turned on, and the signal with the reset level of said $C_{FD}+C_S$ is read out as noise $N_2$.

Next, during the storage period that starts with turning $\phi_R$ off ($T_1$), the photocharge generated in photodiode PD is stored. At that time, for $\phi_T$, the barrier between $C_{PD}$ and $C_{FD}$ is lowered slightly as level (+α). When storage of the charge is started, the photocharge is first stored in $C_{PD}$. When the quantity of photoelectrons exceeds the saturation level of $C_{PD}$, as shown in FIG. 8(B), $\phi_T$ will surpass the barrier that is lowered slightly as level (+α), and the photocharge overflows from CPD and is selectively stored in $C_{FD}+C_S$ in that pixel.

As described above, when the quantity of photoelectrons is below the saturation level of photodiode PD, the photocharge is only stored in $C_{PD}$. When the amount of photocharge is more than the saturation level of photodiode PD, the photocharge is also stored in $C_{FD}$ and $C_S$ in addition to $C_{PD}$.

Figure 8B:
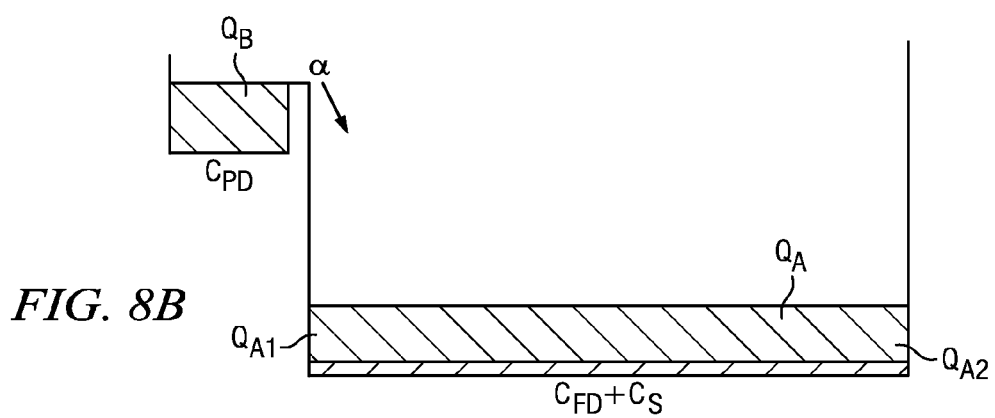

FIG. 8(B) shows the state when $C_{PD}$ is saturated, charge $Q_B$ is stored in $C_{PD}$ before reaching the saturation level, and extra charge $Q_A$ is stored in $C_{FD}$ and $C_S$.

Figure 8C:
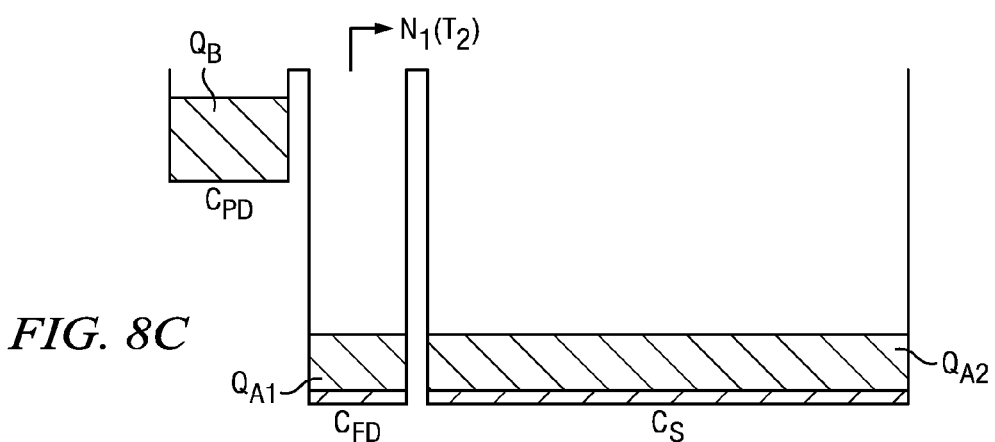

Next, $\phi_T$ returns from level (+α) to off. At time $T_2$, $\phi_S$ is turned off. As shown in FIG. 8(C), the potential of $C_{FD}$ and $C_S$ is divided. At that time, oversaturation charge $Q_A$ is divided into $Q_{A1}$ and $Q_{A2}$ corresponding to the capacitance ratio between $C_{FD}$ and $C_S$. At that time, $\phi_{N1}$ is turned on, and the signal with the level of $C_{FD}$ that stores part $Q_{A1}$ of the oversaturation charge is read out as noise $N_1$.

Figure 9D:
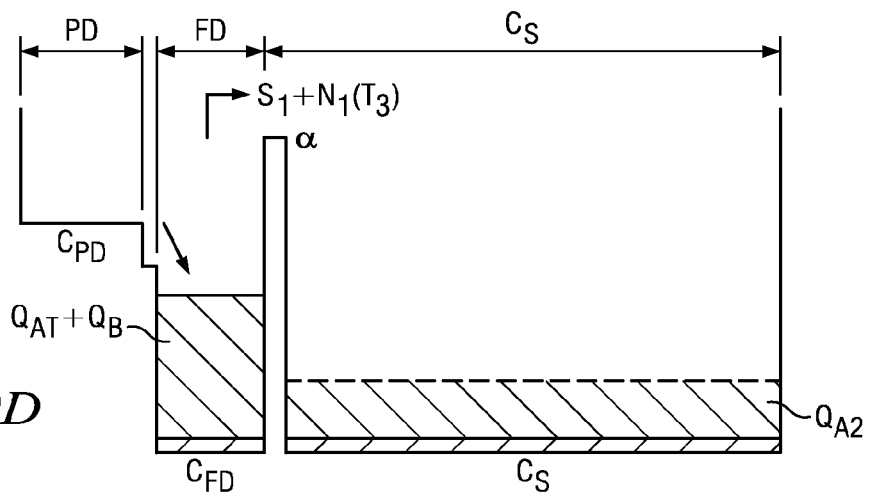
FIGS. 9(D)-(F) are schematic potential diagrams corresponding to the photodiode—storage capacitance element of the CMOS image sensor disclosed in the embodiment of the present invention.

Next, $\phi_T$ is turned on. As shown in FIG. 9(D), pre-saturation charge $Q_B$ stored in $C_{PD}$ is transferred to $C_{FD}$ to mix with part $Q_{A1}$ of the oversaturation charging stored in $C_{FD}$. At that time, since the potential of CPD is shallower than that of $C_{FD}$, and the level of the transfer transistor is deeper than that of $C_{PD}$, all of the pre-saturation charge QB in CPD can be completely transferred to CFD.

Next, at time $T_3$, $\phi_T$ returns to the off state, and $\phi S_1+N_1$ is turned on to read pre-saturation charge signal $S_1$ from the pre-saturation charge $Q_B$ transferred to $C_{FD}$. However, pre-saturation charge $Q_B$ coexists with part $Q_{A1}$ of the oversaturation charge in $C_{FD}$. In fact, the signal read is $S_1+N_1$. FIG. 9(D) shows the state before $\phi_T$ returns to the off state.

Figure 9E:
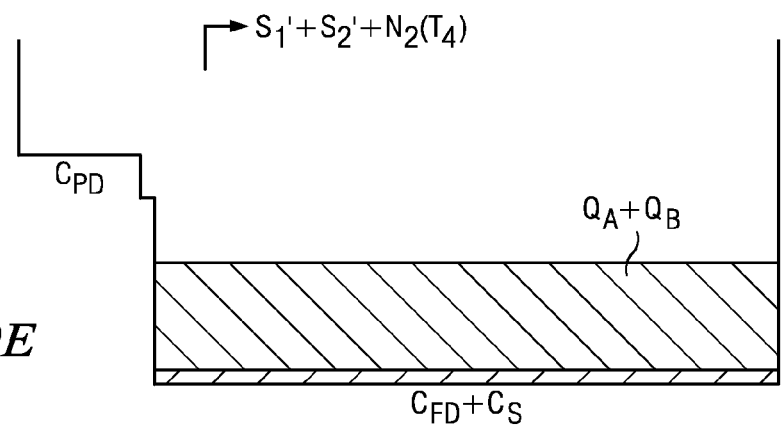

Next, the potentials of $C_{FD}$ and $C_S$ are coupled to each other by turning on $\phi_S$, $\phi_T$. As shown in FIG. 9(E), the sum of the pre-saturation charge $Q_B$ and part $Q_{A1}$ of the oversaturation charge in $C_{FD}$ is mixed with part $Q_{A2}$ of the oversaturation charge in $C_S$. Since the sum of part $Q_{A1}$ of the oversaturation charge and part $Q_{A2}$ of the oversaturation charge is equivalent to oversaturation charge $Q_A$ before the division, the signal of the sum of pre-saturation charge $Q_B$ and oversaturation charge $Q_A$ in the coupled potential of $C_{FD}$ and $C_S$ stays the same.

At time $T_4$, $\phi_T$ returns to the off state, and $\phi_{S1'+S2'+N2}$ is turned on to read the signal of the sum of pre-saturation charge signal $S_1$ and oversaturation charge signal $S_2$ from pre-saturation charge $Q_B$+oversaturation charge $Q_A$ in $C_{FD}+C_S$. In this case, however, since the $C_{FD}+C_S$ noise is included, and the signal is read from the charge in $C_{FD}+C_S$, the actually read signal becomes $S_1'+S_2'+N_2$ ($S_1'$ and $S_2'$ are the values of $S_1$ and $S_2$ reduced and modulated by the capacitance ratio between $C_{FD}$ and $C_S$, respectively). FIG. 9(E) shows the state before $\phi_T$ returns to the off state.

Figure 9F:
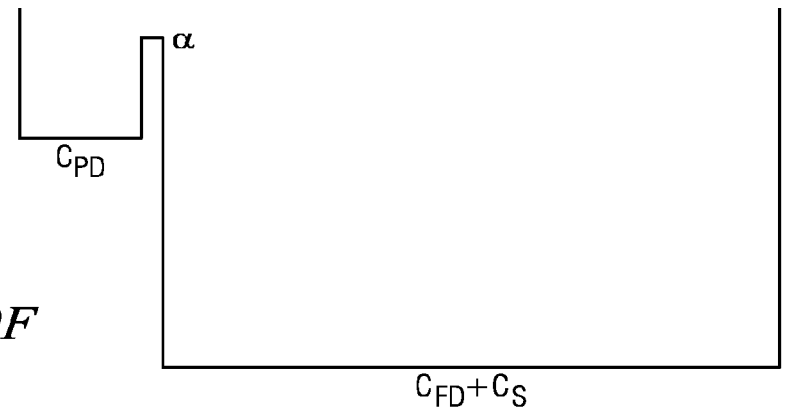

One field (1F) is ended as described above, and the process goes to the next field. With $\phi_S$ in the on state, $\phi_T$, $\phi_R$ are turned on. As shown in FIG. 9(F), the photocharge generated in the previous field is completely discharged, followed by resetting.

In the following, the circuit configuration of the entire CMOS image sensor formed by integrating pixels with the aforementioned configuration in an array pattern will be explained.

FIG. 10 is an equivalent circuit diagram illustrating the circuit configuration of the entire CMOS image sensor disclosed in this embodiment.

Plural (four as shown in the figure) pixels (pixel) are arranged in an array. Driving lines ($\phi_T$, $\phi_S$, $\phi_R$, $\phi_X$) controlled by row shift register $SR^V$ and power supply VDD and ground GND are connected to each pixel (pixel).

Four values, that is, pre-saturation charge signal ($S_1$)+$C_{FD}$ noise ($N_1$), $C_{FD}$ noise (N1), modulated pre-saturation charge signal ($S_1'$)+modulated oversaturation charge signal ($S_2'$)+$C_{FD}+C_S$ noise ($N_2$), and $C_{FD}+C_S$ noise ($N_2$) are output from each pixel to the output lines at the respective timings under the control of column shift register $SR^H$ and driving lines ($\phi_{S1+N1}$, $\phi_{N1}$, $\phi_{S1'+S2'+N2}$, $\phi_{N2}$). In this case, in order to calculate the difference between pre-saturation charge signal ($S_1$)+$C_{FD}$ noise ($N_1$) and $C_{FD}$ noise ($N_1$) at output terminal part $CT_a$ to be explained later, a circuit $CT_b$ including a differential amplifier DC1 can be formed on the CMOS image sensor.

Figure 11:
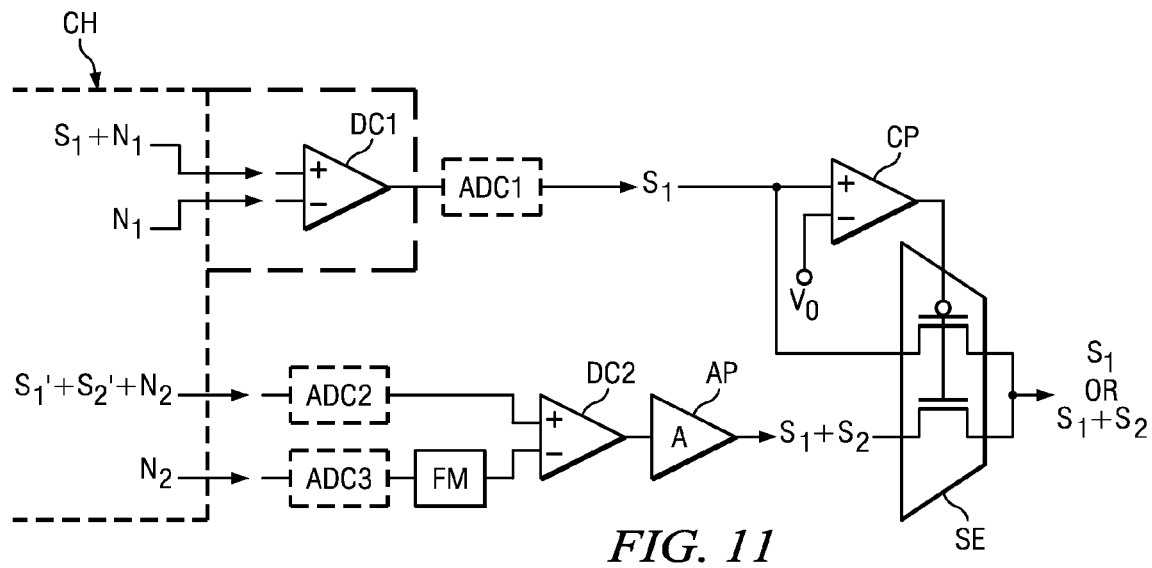
FIG. 11 shows a circuit that processes four signals, that is, a pre-saturation signal+$C_{FD}$ noise, $C_{FD}$ noise, modulated oversaturation charge signal+$C_{FD}$+$C_S$ noise, and $C_{FD}$+$C_S$ noise.

FIG. 11 shows the circuit that processes the four signals, that is, pre-saturation charge signal ($S_1$)+$C_{FD}$ noise ($N_1$), $C_{FD}$ noise ($N_1$), modulated pre-saturation charge signal ($S_1'$)+modulated oversaturation charge signal ($S_2'$)+$C_{FD}+C_S$ noise ($N_2$), and $C_{FD}+C_S$ noise ($N_2$) output as described above.

Pre-saturation charge signal ($S_1$)+$C_{FD}$ noise ($N_1$) and $C_{FD}$ noise ($N_1$) are input to differential amplifier $DC_1$, and $C_{FD}$ noise ($N_1$) is cancelled by calculating their difference to obtain pre-saturation charge signal ($S_1$). Pre-saturation charge signal ($S_1$) can be digitized by an A/D converter ADC1 used as demanded or used directly as an analog signal without using ADC1.

On the other hand, modulated pre-saturation charge signal ($S_1'$)+modulated oversaturation charge signal ($S_2'$)+$C_{FD}+C_S$ noise ($N_2$) and $C_{FD}+C_S$ noise ($N_2$) are input to differential amplifier DC2. The $C_{FD}+C_S$ noise ($N_2$) is cancelled by calculating their difference. Then, the signal is resumed by amplifier AP depending on the capacitance ratio between $C_{FD}$ and $C_S$ to be adjusted to the same gain as pre-saturation charge signal ($S_1$). In this way, the sum of pre-saturation charge signal and the oversaturation signal ($S_1+S_2$) is obtained. Signals $S_1'+S_2'+N_2$ and $N_2$ can be digitized by A/D converters ADC2, 3 used as demanded before they are input into differential amplifier DC2. They can also directly input as analog signals into differential amplifier DC2 without using ADC2, 3. In this case, as shown in the timing chart in FIG. 7, since $C_{FD}+C_S$ noise ($N_2$) is obtained earlier than other signals, it is temporarily stored in frame memory FM used as a storage means until other signals are obtained. Said noise is read from frame memory FM at the time when other signals are obtained, and the following processing is carried out.

In the following, resuming said modulated pre-saturation charge signal ($S_1'$)+modulated oversaturation charge signal ($S_2'$) will be explained.

$S_1'$, $S_2'$, α (charge distributing ratio of $C_{FD}$ to $C_{FD}+C_S$) are expressed as follows.

$$S_1' = S_1 \times \alpha \quad (1)$$

$$S_2' = S_2 \times \alpha \quad (2)$$

$$\alpha = C_{FD}/(C_{FD}+C_S) \quad (3)$$

Consequently, by calculating α a from the values of $C_{FD}$ and $C_S$ according to equation (3) and plugging it into equations (1) and (2), the signal can be resumed to $S_1+S_2$ and adjusted to the same gain as S1 obtained separately.

Next, either $S_1$ or $S_1+S_2$ obtained as described above is selected and used as the final output as shown in FIG. 11. First, $S_1$ is input into comparator CP and compared with preset reference potential Vo. On the other hand, $S_1$ and $S_1+S_2$ are input into selector SE, which selects either $S_1$ or $S_1+S_2$ corresponding to the output of said comparator CP. Reference potential Vo is a potential selected before reaching saturation corresponding to the capacitance of photodiode PD. For example, it can be 0.3 V. That is, Vo is subtracted from $S_1$. If a negative result is obtained, that is, if $S_1$ is smaller than Vo, it means that photodiode PD is not saturated, and $S_1$ is output.

On the other hand, if a positive result is obtained by subtracting Vo from $S_1$, that is, if $S_1$ is larger than Vo, it means that photodiode PD is saturated, and $S_1+S_2$ will be output. For example, the circuit up to this output is formed on CMOS image sensor chip CH, while the circuit of amplifier DC1 and frame memory FM and thereafter are realized externally. It is also possible to form said differential amplifier DC1 on CMOS image sensor chip CH.

Also, since the circuit of amplifier DC1 and frame memory FM and thereafter handles a large amount of analog data, A/D is preferable conversion before inputting data into differential amplifier DC1 and frame memory FM for digital processing in amplifier DC1 and frame memory FM and thereafter. In this case, it is preferable to amplify the signals by using an amplifier not shown in the figure according to the input range of the A/D converter used.

As described above, in the CMOS image sensor disclosed in this embodiment, two signals, that is, pre-saturation charge signal ($S_1$) and the sum of pre-saturation charge signal and oversaturation signal ($S_1+S_2$) are obtained for each field for each pixel. In fact, whether photodiode PD ($C_{PD}$) is saturated or close to the saturated state is determined, and either S1 or $S_1+S_2$ is selected.

Figure 12A:
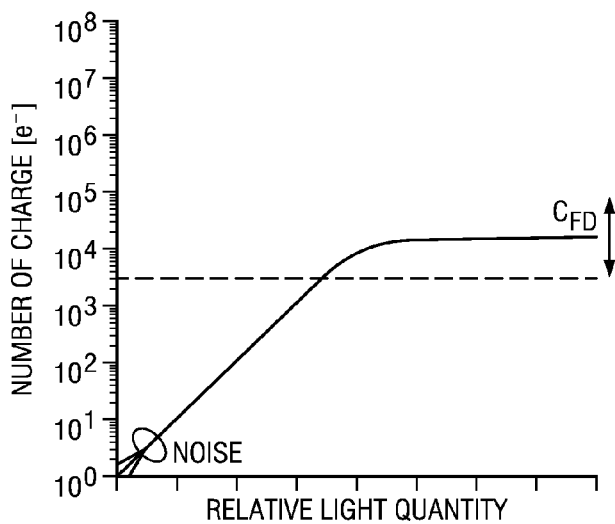
FIGS. 12(A) and 12(B) are diagrams of the number of charge obtained when using capacitance $C_{FD}$ or capacitance $C_{FD}$+$C_S$ vs. the relative light quantity.
Figure 12B:
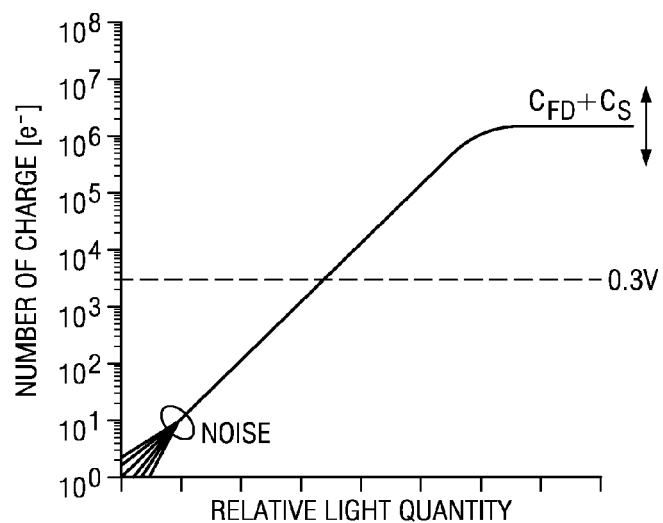

FIG. 12(A) is a diagram plotting the amount of charge obtained when using capacitor $C_{FD}$ as described above versus the relative light quantity. This is equivalent to signal S1. On the other hand, FIG. 12(B) is a plot of the number of charge obtained when using capacitor $C_{FD}+C_S$ as described above versus the relative light quantity. This is equivalent to signal $S_1+S_2$.

For example, for reference potential Vo (for example, 0.3 V), signal $S_1$ shown in FIG. 12(A) is used on the low illuminance side, while signal $S_1+S_2$ shown in FIG. 12(B) is used on the high illuminance side. In this case, noise is present in the low illuminance region in the two diagrams. The noise of signal $S_1$ is smaller than that of signal $S_1+S_2$. Since signal $S_1$ is adopted on the low illuminance side, the noise level will not be increased.

Also, the saturated potential of $C_{FD}$ varies among different pixels. The number of charge varies in the range of $1\times10^4$-$2\times10^4$. However, since switching to signal $S_1+S_2$ using $C_{FD}+C_S$ occurs before entering that region, an influence in variation in the saturated potential of $C_{FD}$ can be avoided.

Also, even if reference potential Vo varies, since the number of charge of $C_{FD}$ is consistent with that of $C_S$ near the reference potential, there is no problem in using signal $S_1$ or signal $S_1+S_2$ near the reference potential.

Figure 12C:
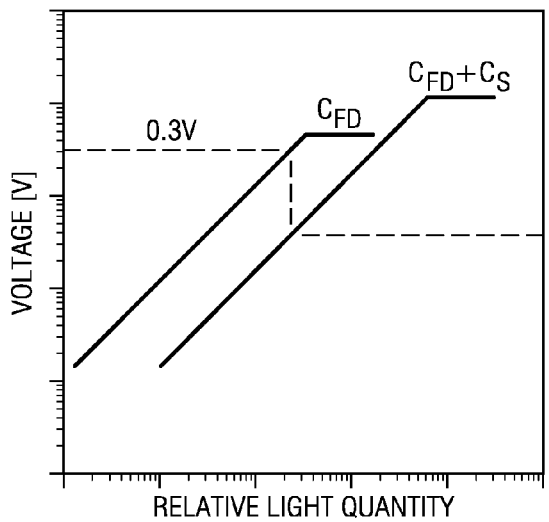
FIG. 12(C) is obtained by converting the number of charge shown in FIGS. 12(A) and 12(B) to voltage and showing the voltage versus the relative light quantity.

FIG. 12(C) is the result of superimposing FIG. 12(A) that shows the voltage of the floating diffusion when using capacitance $C_{FD}$ versus the relative light quantity (represented as $C_{FD}$) and FIG. 12(B) that shows the voltage of the floating diffusion when using capacitance $C_{FD}+C_S$ versus the relative light quantity (represented as $C_{FD}+C_S$). They correspond to the results of converting the diagrams shown in FIGS. 12(A) and 12(B) from the number of charge into voltage. However, when capacitance $C_{FD}+C_S$ is used, even if the light quantity is the same and the same number of charge is obtained, since the divided capacitance value of $C_S$ is increased, the converted voltage is lowered correspondingly. For example, signal $S_1$ represented by $C_{FD}$ is used on the low illuminance side before exceeding reference potential 0.3 V as described above. On the high luminance side after exceeding 0.3 V, the signal used is switched to $S_1+S_2$ represented by $C_{FD}+C_S$.

Figure 13:
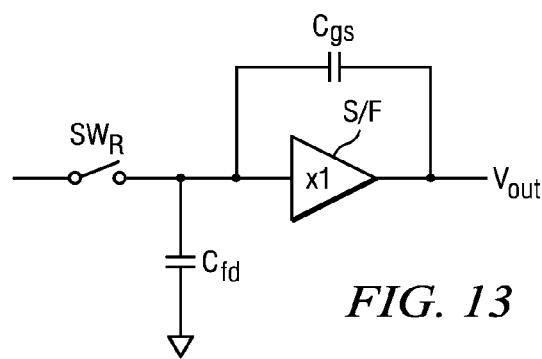
FIG. 13 is a circuit diagram of the source follower part with the gain set at 1 in a solid-state image device disclosed in an embodiment of the present invention.

FIG. 13 is the circuit diagram of the source follower part with a gain of 1 in the solid-state image pickup device disclosed in this embodiment.

In the solid-state image pickup device disclosed in this embodiment, by keeping the gain of the source follower at 1, the FD capacitance (floating diffusion) of about 1 fF in a conventional FD structure can be almost halved. The capacitance around the FD contact including capacitance $C_{fd}$ of the floating diffusion is about 0.3 fF in both a conventional structure and the present embodiment at the 0.25 µm rule.

On the other hand, regarding the capacitance around the source follower transistor including capacitance $C_{gs}$ between the gate and source of the source follower is concerned, since $C_{ox}+C_{gs}$, which is about 0.5 fF, can be virtually considered to be zero, by setting the gain at 1 $C_{gd}$ of the source follower transistor is left. The capacitance is reduced from 0.7 fF of the conventional structure to about 0.2 fF. As described above, the FD capacitance as the sum of the capacitance around the FD contact and the capacitance of the source follower transistor is halved from about 1.0 fF to 0.5 fF.

In the solid-state image pickup device disclosed in this embodiment, in order to obtain the reference potential before the FD part transfers charge, resetting by switch SWR using the reset transistor is necessary. In this case, since the FD capacitance is very small, the reset level due to the capacitance coupling between the gate of the reset transistor and the FD part is fairly low. For example, if the FD capacitance is halved, the variation in the reset level depending on the feed through will be doubled.

Also, since the FD capacitance is small, even if the same amount of charge as in conventional technology is transferred from the PD, the amplitude will be doubled. As described above, the number of saturation signal electrons of the FD is also reduced sharply as a result of reducing the FD capacitance.

So-called bootstrapping is preferable by setting a reset switch on the output signal line Vout of the pixel to perform reset near 0 V to turn on the source follower. In this way, due to capacitance $C_{gs}$ between the gate and source of the source follower, along with the rise of potential on the source side (the side of the output signal line), the FD potential also rises, and the reset potential of FD can be increased. In this case, in order to improve the bootstrap effect, it is necessary to increase the capacitance $C_{gs}$ between the gate and source of the source follower.

As shown in FIG. 4(A), the capacitance between the gate and source of the source follower is equivalent to the capacitance between second wiring 65 connected to the n+-type semiconductor region 40 of source follower Tr4 and first wiring 62 connected to the gate electrode 60 of source follower Tr4. That is, the bootstrapping controls the potential of floating diffusion FD by controlling the potential of the second wiring 65. In this case, as shown in FIG. 4(A), the first wiring 62 connected to the gate electrode 60 of source follower Tr4 and the second wiring 65 connected to n+-type semiconductor region 40 of source follower Tr4 have a superimposed region via the second interlayer insulating film 53. The capacitance $C_{gs}$ between the gate and source of the source follower can be increased by constituting an electrostatic element from the first wiring 62, the second interlayer insulating film 53, and the second wiring 65. The aforementioned bootstrap operation can be carried out effectively.

Figure 14:
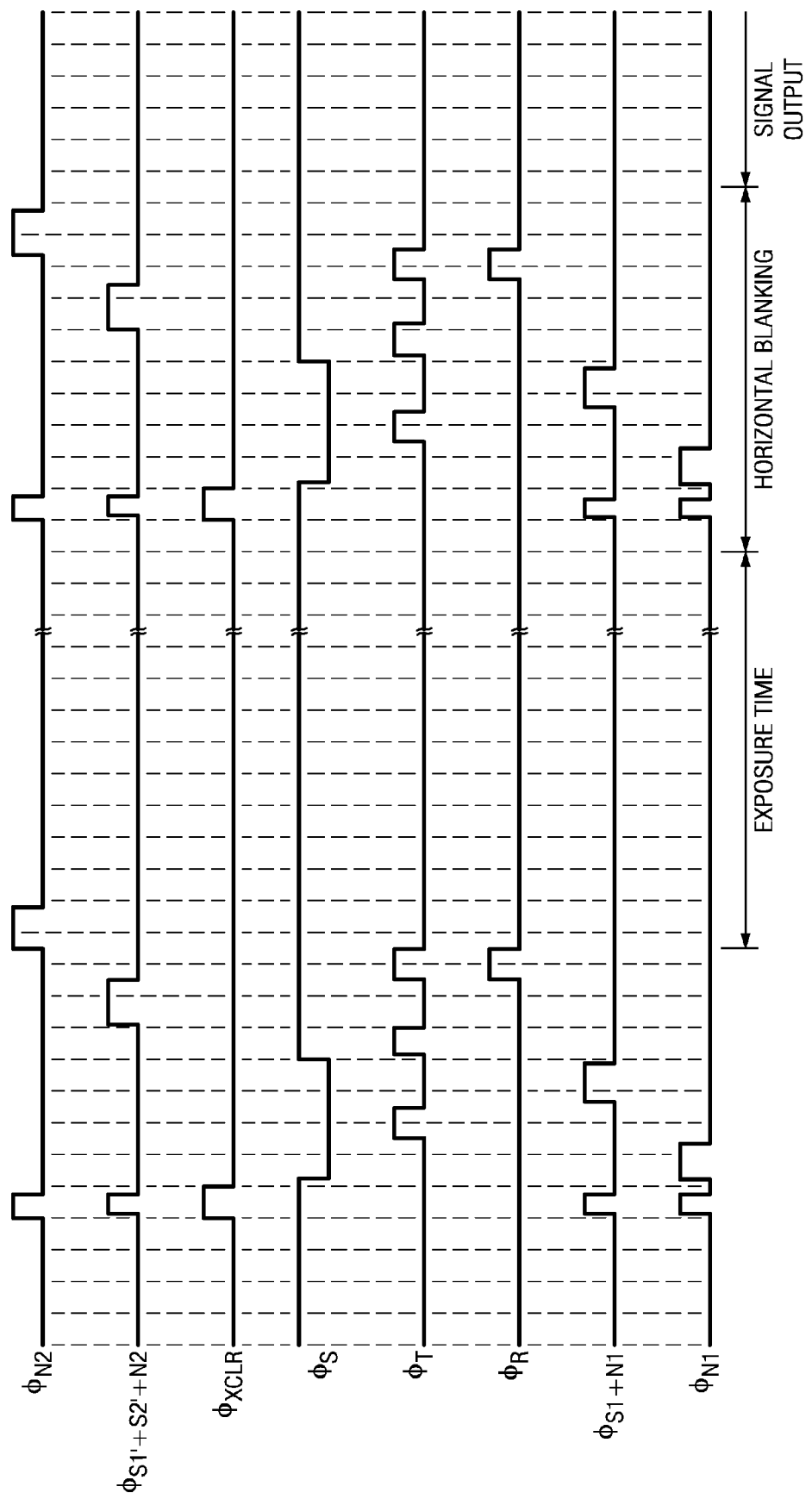
FIG. 14 is a timing chart illustrating the voltage applied to the driving line in the case of performing a bootstrap operation in a solid-state image pickup device disclosed in an embodiment of the present invention.

FIG. 14 is a timing chart illustrating the voltage applied to the driving line in the case of performing the aforementioned bootstrap operation.

When exposure is finished and immediately after the horizontal blanking period is started, reset switch $\phi_{XCLR}$ connected to the pixel output line is turned on to reset the pixel output line to 0 V. In this case, by also turning on driving lines $\phi_{S1+N1}$, $\phi_{N1}$, $\phi_{S1'+S2'+N2}$, $\phi N_2$ during the period when said reset switch $\phi_{XCLR}$ is on, the electrostatic capacitance element used for temporarily storing noise $N_2$, noise $N_1$, signal $S_1+N_1$, signal $S_1'+S_2'+N_2$ is also reset.

In addition to this, the timing chart is virtually the same as the timing chart shown in FIG. 7. Also, the configuration of the circuit used for performing the reset operation is as shown in FIG. 10.

When the field effect transistor with the aforementioned configuration is used as an amplification transistor (source follower) in the solid-state image pickup device with an expanded dynamic range disclosed in this embodiment, the linearity of signal $S_1$ can be improved. Also, when the gain of the source follower is set near 1, the capacitance $C_{gs}$ between the gate and source of the source follower can be increased so that the saturation level can be increased.

When the field effect transistor disclosed in the present embodiment is used as an amplification transistor in a solid-state image pickup device with an expanded dynamic range, the linearity of signal $S_1$ can be improved, and the saturation level can be increased. A transistor with a gain of almost 1 can be realized, and the on resistance can be lowered due to the back gate effect.

The present invention is not limited to the aforementioned explanation. For example, the CMOS sensor explained above has five transistors per pixel. The present invention can also be applied to a CMOS sensor having more transistors. Other various changes can also be made as long as they do not deviate from the main point of the present invention. The field effect transistor of the present invention can be used as an amplification transistor (source follower) or other field effect [transistors] constituting pixels of a CMOS image sensor. The solid-state image pickup device of the present invention can be used for a CMOS image sensor or CCD image sensor in a digital camera or camera-attached cellular phone or other image sensors for which a wide dynamic range is desired.

The invention claimed is:

1. An apparatus formed by integrating a plurality of pixels in an array pattern on a semiconductor substrate, the apparatus comprising:
a photodiode that receives light and generates and stores photocharge;
a transfer transistor that transfers photocharge from the photodiode;
a floating diffusion to which the photocharge is transferred via the transfer transistor;
a storage capacitance element that is connected to the photodiode via the transfer transistor and at least stores the photocharge overflowing from the photodiode via the transfer transistor during a storage operation;
a storage transistor, which couples or separates the potentials of the floating diffusion and storage capacitance element and has one source/drain regions acting as the floating diffusion and another source/drain region connected to the storage capacitance element; and
an amplification transistor, which is a field effect transistor having a first semiconductor layer of a first electroconductivity type having a channel forming region, a gate electrode formed via an insulating film on the channel forming region of the first semiconductor layer and connected to the floating diffusion, a pair of second semiconductor layers of a second electroconductivity type formed on the surface of the first semiconductor layer on the two sides of the gate electrode, and a third semiconductor layer of the second electroconductivity type formed in the first semiconductor layer at a prescribed depth below the channel forming region and connected to one of the second semiconductor layers.

2. The apparatus described in claim 1 further comprising:
a puncture inhibiting layer of the first electroconductivity type is formed between the third semiconductor layer and the other second semiconductor layer in the first semiconductor layer.

3. The apparatus described in claim 2 further comprising:
a first wiring formed to connect the floating diffusion and gate electrode, a second wiring formed to be connected to one of the second semiconductor layers;
the first and second wirings having a superimposed region via an insulating film;
an electrostatic capacitance element being formed by the first wiring, insulating film, and second wiring.

4. The apparatus described in claim 2 wherein the potential of the floating diffusion is controlled by controlling the potential of the second wiring.

5. The apparatus described in claim 2 further comprising a reset transistor connected to the storage capacitance element or floating diffusion and used to discharge photocharge in the storage capacitance element and/or the floating diffusion.

6. The apparatus described of claim 2 further comprising a selecting transistor that is connected in series with the amplification transistor and has a gate electrode for the selecting transistor and is used to select the pixels.

7. The apparatus described in claim 1 further comprising:
a first wiring formed to connect the floating diffusion and gate electrode, a second wiring formed to be connected to one of the second semiconductor layers;
the first and second wirings having a superimposed region via an insulating film;
an electrostatic capacitance element being formed by the first wiring, insulating film, and second wiring.

8. The apparatus described in claim 7 wherein the potential of the floating diffusion is controlled by controlling the potential of the second wiring.

9. The apparatus described in claim 7 further comprising a reset transistor connected to the storage capacitance element or floating diffusion and used to discharge photocharge in the storage capacitance element and/or the floating diffusion.

10. The apparatus described of claim 7 further comprising a selecting transistor that is connected in series with the amplification transistor and has a gate electrode for the selecting transistor and is used to select the pixels.

11. The apparatus described in claim 1 wherein the potential of the floating diffusion is controlled by controlling the potential of the second wiring.

12. The apparatus described in claim 11 further comprising a reset transistor connected to the storage capacitance element or floating diffusion and used to discharge photocharge in the storage capacitance element and/or the floating diffusion.

13. The apparatus described of claim 11 further comprising a selecting transistor that is connected in series with the amplification transistor and has a gate electrode for the selecting transistor and is used to select the pixels.

14. The apparatus described in claim 1 further comprising a reset transistor connected to the storage capacitance element or floating diffusion and used to discharge photocharge in the storage capacitance element or the floating diffusion.

15. The apparatus described of claim 14 further comprising a selecting transistor that is connected in series with the amplification transistor and has a gate electrode for the selecting transistor and is used to select the pixels.

16. The apparatus described of claim 1 further comprising a selecting transistor that is connected in series with the amplification transistor and has a gate electrode for the selecting transistor and is used to select the pixels.

* * * * *